(12) United States Patent
Balog (10) Patent No.: US 7,737,716 B2
(45) Date of Patent: Jun. 15, 2010

(54) METHODS AND SYSTEMS FOR SEMICONDUCTOR TESTING USING REFERENCE DICE

(75) Inventor: Gil Balog, Jerusalem (IL)

(73) Assignee: OptimalTest Ltd., Nes-Zionna (IL)

( * ) Notice: Subject to any disclaimer, the term of this patent is extended or adjusted under 35 U.S.C. 154(b) by 0 days.

(21) Appl. No.: 12/346,129

(22) Filed: Dec. 30, 2008

(65) Prior Publication Data

US 2009/0119048 A1    May 7, 2009

Related U.S. Application Data

(62) Division of application No. 11/480,452, filed on Jul. 5, 2006, now Pat. No. 7,532,024.

(51) Int. Cl.
*G01R 31/26* (2006.01)

(52) U.S. Cl. ..................................... 324/765

(58) Field of Classification Search ............. 324/158.1, 324/750–765, 73.1; 371/15.1, 22.6, 25.1
See application file for complete search history.

(56) References Cited

U.S. PATENT DOCUMENTS

| | | | |
|---|---|---|---|
| 4,639,664 A | 1/1987 | Chiu et al. |
| 5,210,041 A | 5/1993 | Kobayashi et al. |
| 5,477,544 A | 12/1995 | Botelho |
| 5,541,862 A | 7/1996 | Bright et al. |
| 5,726,920 A | 3/1998 | Chen et al. |
| 5,801,965 A | 9/1998 | Takagi et al. |
| 5,822,218 A | 10/1998 | Moosa et al. |
| 5,901,154 A | 5/1999 | Motohama et al. |
| 5,910,895 A | 6/1999 | Proskauer et al. |
| 5,991,699 A | 11/1999 | Kulkarni et al. |
| 6,128,759 A | 10/2000 | Hansen |
| 6,154,714 A | 11/2000 | Lepejian |
| 6,184,048 B1 | 2/2001 | Ramon |
| 6,351,681 B1 | 2/2002 | Chih et al. |
| 6,373,011 B1 | 4/2002 | Beffa |
| 6,512,985 B1 | 1/2003 | Whitefield et al. |
| 6,546,308 B2 | 4/2003 | Takagi et al. |
| 6,549,027 B1 | 4/2003 | Mott |
| 6,563,070 B2 | 5/2003 | Capser |
| 6,591,152 B1 | 7/2003 | Takano |
| 6,601,203 B1 | 7/2003 | Asano et al. |
| 6,607,926 B1 | 8/2003 | Toprac et al. |
| 6,618,682 B2 | 9/2003 | Bulaga et al. |
| 6,618,853 B1 | 9/2003 | Ohyama et al. |

(Continued)

FOREIGN PATENT DOCUMENTS

JP    04313084    11/1992

*Primary Examiner*—Ha Tran T Nguyen
*Assistant Examiner*—Trung Q Nguyen
(74) *Attorney, Agent, or Firm*—Occhiuti Rohlicek & Tsao LLP (57) ABSTRACT

Methods and systems of semiconductor testing where reference dice and non-reference dice in a wafer and/or lot are tested differently. In one embodiment of the invention, geography, lithography exposure, other characteristics, performance and/or behavior are taken into account when selecting reference dice, thereby improving the likelihood that the response of reference dice to testing is well representative of the wafer and/or lot. In one embodiment, based on data from the testing of reference dice, the test flow for non-reference dice and/or other testing may or may not be adjusted.

17 Claims, 5 Drawing Sheets

U.S. PATENT DOCUMENTS

| | | |
|---|---|---|
| 6,633,014 B2 | 10/2003 | Casper |
| 6,675,362 B1 | 1/2004 | Ortiz et al. |
| 6,711,514 B1 | 3/2004 | Bibbee |
| 6,747,228 B2 | 6/2004 | Capser |
| 6,779,140 B2 | 8/2004 | Krech, Jr. et al. |
| 6,842,022 B2 | 1/2005 | Khoche |
| 6,907,378 B2 | 6/2005 | Stirrat et al. |
| 7,265,570 B2 | 9/2007 | Ong |
| 7,340,359 B2 | 3/2008 | Erez et al. |
| 2002/0063085 A1 | 5/2002 | Capser |
| 2002/0079252 A1 | 6/2002 | Capser |
| 2003/0120457 A1 | 6/2003 | Singh et al. |
| 2003/0224552 A1 | 12/2003 | Subramanian |
| 2004/0088074 A1 | 5/2004 | Chen et al. |
| 2004/0215361 A1 | 10/2004 | Hlotyak et al. |
| 2004/0225459 A1 | 11/2004 | Krishnaswamy et al. |
| 2004/0236531 A1 | 11/2004 | Madge |
| 2005/0154551 A1 | 7/2005 | Pramanick et al. |
| 2005/0253617 A1 | 11/2005 | Roberts et al. |
| 2005/0273685 A1 | 12/2005 | Sachdev et al. |
| 2006/0170435 A1 | 8/2006 | Granicher et al. |
| 2007/0236232 A1 | 10/2007 | Aghababazadeh et al. |
| 2008/0007284 A1 | 1/2008 | Balog |

METHODS AND SYSTEMS FOR SEMICONDUCTOR TESTING USING REFERENCE DICE

CROSS-REFERENCE TO RELATED APPLICATIONS

This application is a divisional application from U.S. application Ser. No. 11/480,452 filed Jul. 5, 2006. The content of which is hereby incorporated by reference in its entirety.

FIELD OF THE INVENTION

The invention relates to semiconductor testing.

BACKGROUND OF THE INVENTION

A semiconductor product has a product life cycle which typically comprises a launching stage, a high volume manufacturing stage and an end of life stage. The launching stage includes for example engineering and debugging the product. The high volume manufacturing stage includes for example manufacturing the product in large quantities. During the end of life stage while the product is being ramped down, a successor product may in some cases be ramped up (i.e. launched). During one or more stages of the product life, the product is typically tested to ensure quality.

However, testing has emerged as a key constraint in the push for more advanced, reliable and cost-effective semiconductor based products. Advances in semiconductor process technology have enabled chip designers to pack high volume production chips with 100 million transistors. Experts predict this will increase to more than 1 billion transistors within the next few years.

Semiconductor process technology is characterized by Moore's Law, which states that the numbers of transistors in a given surface area will double every 18 months. Much of this density increase is driven by smaller and smaller line widths or geometries. Today 90 nm devices are common and 25 nm designs are in development (a nanometer is one millionth of a meter or $1/1200$th width of human hair). These advances place a strain on test systems as more transistors and structures must be tested. This exponential growth rate also drives a continual increase in the process, design and manufacturing complexities which, in turn, can increase systemic problems that affect quality, yield and product reliability. All of these factors tend to drive the need for more test time and more comprehensive testing, thus test cost has become a major factor in the overall manufacturing cost of an integrated circuit.

Some terms used in semiconductor testing industry will now be illuminated. The definitions are presented informally to aid in the understanding of the reader and therefore should not be considered binding:

An integrated circuit (IC) is a small electronic device made out of a semiconductor material.

A wafer is a thin slice of semiconductor material, such as silicon, upon which microcircuits are constructed by doping (for example, diffusion or ion implantation), etching, and deposition of various materials.

A wafer is usually made up of many single units also called dice (one unit=die, two or more units=dice). After the fabrication process is completed, the wafer will be cut during the assembly process and each die may be connected into a package using aluminum (or occasionally gold) wires which are welded to pads, usually found around the edge of the die.

There are various testing stages. For example, sort (also known as wafer probe) is done while the units are still at wafer level. For example, final test is done after the units have been packaged.

A "touchdown" is the term used when the interface unit (either at Sort—prob-card or Final Test—contactor) "touches" the unit under test. In parallel testing, units tested at the same time have the same touchdown.

Note that the term device may have many meanings in semiconductor testing, including integrated circuits, product type, wafer or die and the meaning should be construed based on the context.

The term lot may also have more than one meaning in semiconductor testing. Typically although not necessarily in fabrication, E-test (Electrical Test or Parametric Electrical Test), and sort test, a (fabrication) lot refers to a plurality of wafers that were manufactured at the same time, whereas in burn in, final test, and system validation, a (n assembly) lot typically although not necessarily refers to a plurality of units that were tested in the same batch.

In one test floor configuration, there are one or more testing stations. In each station there are a tester (test equipment) and a prober or handler (the prober is configured to handle a wafer and the handler is configured to handle an individual unit). The tester and prober/handler together are considered the test module. On the prober/handler sits an interface unit—probecard or contactor configured to hold a wafer or individual packaged unit. One or more station controllers control the tester and the prober/handler. For example one station controller may control both the tester and the prober/handler. As another example one station controller may control the tester and another station controller may control the prober/handler. Upon receiving instructions from the controlling station controller, the prober/handler takes the device to the tester so that the tester can test the device. Typically, although not necessarily, the tester and the station controller include programs which, when run, cause the tester and the station controller to perform the testing in accordance with the programs.

Currently testing is performed by two basic methods. Either, devices are tested individually and sequentially, or several are tested at the same time in "parallel". Individual testing is more common with complex products such as CPUs while memory devices are most often tested in parallel. Note, however, that these examples are not binding. Currently, there are various test sockets (also known as "aka" operations or stages) for a given product. A test socket is an operation that may be distinguished by a specific testing type at specific test conditions. For instance, for a given socket, a set of tests is performed at a given temperature, whereas for another socket, the same (or similar) tests are performed at a different temperature. By way of another example, functional tests are applied at the first socket and structural tests are applied at the second socket. Test sockets include (again, non-binding): E-test, Sort (or wafer probe test), Burn-in, Final Test, and System Validation. Each socket may include various sub-steps such as Sort1, Sort2 and Sort3. Sort is done while the dice (aka devices or units) are still at the wafer level whereas at Final test, the semiconductor devices have been packaged. The main goal of the specified stages is to separate out potentially good devices from those that fail testing. Electrical parametric tests are executed on the wafers scribe line (between the dice) and usually measure transistor parametric characteristics. Burn-in is executed, after packaging, in order to simulate an extended life cycle by stressing the devices at a high temperature (in a burn-in oven) while applying an elevated voltage at an extended duration. It is important to note that there are various types of burn-in. Some methods only "bake" the devices at a high temperature, others apply an elevated voltage as well and some perform all this while executing a functional pattern (with high toggle coverage) on the device IO's. System validation is performed usually as the last step by testing the device in "customer mode". For example a CPU device will be placed on an actual motherboard and "booted-up" using an operating system as well as testing other software applications.

In summary, every product may potentially go through a different flow. In some cases, all devices of the same product are tested with a predetermined set of tests in a predetermined test flow. In other cases, not all devices of the same product necessarily go through the entire flow. For example, burn-in and system validation are good examples where devices may be tested in "sample mode".

For example, based on statistical data relating to a test, it may be determined to skip the test entirely or to sample the test (i.e. to have less than all of the devices undergo the test, where for sampling purposes it is important how many devices undergo the test but not which devices). The statistical data may have been collected, for example, from a baseline of devices within the population of the wafer or lot that were 100% tested. In addition or instead, a sample (baseline) of devices may be tested prior to full scale testing, in order to determine the efficacy of a proposed test flow for the remainder of the devices. For example, prior to full scale testing the baseline may undergo a comprehensive set of tests and through analysis of the test results an effective set of tests to be performed on all remaining devices in a wafer or lot for a given product can be determined.

After a device has been tested, the device is placed in a bin (which may be a physical bin and/or a data accounting bin) with each bin corresponding to the pass/fail results of the test flow executed on the device. For example, one bin may correspond to devices which pass all tests in the executed test flow, while other bins correspond to devices which failed one or more tests and/or reflect different failure mechanisms. For example, some of the bins may identify devices that have correctible failures (for example correctible by replacing bad cells with redundant memory cells) and other bins may identify devices exhibiting lower performance than better devices. Binning (placing devices into appropriate bins) is a way of categorizing and/or sorting the tested devices into appropriate groupings, where the binning decision (i.e. decision in which bin to place a given device) device is typically made at the end of the test flow on that device.

SUMMARY OF THE INVENTION

According to the present invention, there is provided: a system for semiconductor testing, comprising: a test manager configured to determine a group of semiconductor dice in a wafer which can be assumed to respond similarly to testing, wherein the group includes less than all dice in the wafer, and configured to select at least one reference die from the group for testing differently than other dice in the group which were not selected as reference dice, wherein the at least one reference die includes less than all dice in the group.

According to the present invention, there is also provided a method of semiconductor testing, comprising: identifying or not identifying a semiconductor die provided for testing as a reference die which had been previously selected as representative of a group of dice in a wafer that can be assumed to respond similarly to testing, wherein the group includes less than all dice in the wafer, and wherein less than all dice in the group had been previously selected as a reference die; if the die is identified as a reference die, testing the die with a reference die test flow; and if the die is not identified as a reference die, testing the die with a non-reference die test flow.

According to the present invention, there is further provided: a method of semiconductor testing, comprising: determining a group of semiconductor dice in a wafer which can be assumed to respond similarly to testing, wherein the group includes less than all dice in the wafer; selecting at least one reference die from the group, wherein the at least one reference die includes less than all dice in the group; and applying test flows to the group, wherein a test flow applied to a selected reference die from the group differs from a test flow applied to a die which was not selected as a reference die from the group.

According to the present invention, there is provided: a method of semiconductor testing, comprising: determining a group of semiconductor dice in a wafer which can be assumed to respond similarly to testing, wherein the group includes less than all dice in the wafer; and selecting at least one reference die from the group for testing differently than other dice in the group which were not selected as reference dice, wherein the at least one reference die includes less than all dice in the group.

According to the present invention, there is also provided: a system for semiconductor testing, comprising: a test cell configured to identify or not identify a semiconductor die provided for testing as a reference die which had been previously selected as representative of a group of dice in a wafer that can be assumed to respond similarly to testing, wherein the group includes less than all dice in the wafer, and wherein less than all dice in the group had been previously selected as a reference die; configured to test the die with a reference die test flow, if the die is identified as a reference die, and configured to test the die with a non-reference die test flow if the die is not identified as a reference die.

According to the present invention, there is further provided: a computer program product comprising a computer useable medium having computer readable program code embodied therein of semiconductor testing, the computer program product comprising: computer readable program code for causing the computer to determine a group of semiconductor dice in a wafer which can be assumed to respond similarly to testing, wherein the group includes less than all dice in the wafer; and computer readable program code for causing the computer to select at least one reference die from the group for testing differently than other dice in the group which were not selected as reference dice, wherein the at least one reference die includes less than all dice in the group.

According to the present invention, there is still further provided: a computer program product comprising a computer useable medium having computer readable program code embodied therein of semiconductor testing, the computer program product comprising: computer readable program code for causing the computer to identify or not identify a semiconductor die provided for testing as a reference die which had been previously selected as representative of a group of dice in a wafer that can be assumed to respond similarly to testing, wherein the group includes less than all dice in the wafer, and wherein less than all dice in the group had been previously selected as a reference die; computer readable program code for causing the computer to test the die with a reference die test flow if the die is identified as a reference die; and computer readable program code for causing the computer to test the die with a non-reference die test flow if the die is not identified as a reference die.

DESCRIPTION OF THE DRAWING FIGURES

These and other objects, features and advantages of the present invention will be apparent from a consideration of the following Detailed Description of the Invention when considered with the drawing Figures, in which.

DETAILED DESCRIPTION OF THE INVENTION

Described herein are embodiments of the current invention for semiconductor testing using reference dice.

As used herein, the phrase "for example," "such as" and variants thereof describing exemplary implementations of the present invention are exemplary in nature and not limiting.

The present invention is primarily disclosed as a method and it will be understood by a person of ordinary skill in the art that an apparatus such as a conventional data processor incorporated with a database, software and other appropriate components could be programmed or otherwise designed to facilitate the practice of the method of the invention.

Unless specifically stated otherwise, as apparent from the following discussions, it is appreciated that throughout the specification discussions, utilizing terms such as, "processing", "computing", "calculating", "determining", "applying", "associating", "providing" or the like, refer to the action and/or processes of any combination of software, hardware and/or firmware. For example, in one embodiment a computer, computing system, processor or similar electronic computing device may manipulate and/or transform data represented as physical, such as electronic, quantities within the computing system's registers and/or memories into other data, similarly represented as physical quantities within the computing system's memories, registers or other such information storage, transmission or display devices.

Embodiments of the present invention may use terms such as, processor, computer, apparatus, system, sub-system, module, unit, device (in single or plural form) for performing the operations herein. These terms, as appropriate, refer to any combination of software, hardware and/or firmware configured to perform the operations as defined and explained herein. The module(s) (or counterpart terms specified above) may be specially constructed for the desired purposes, or it may comprise a general purpose computer selectively activated or reconfigured by a computer program stored in the computer. Such a computer program may be stored in a computer readable storage medium, such as, but not limited to, any type of disk including optical disks, CD-ROMs, magnetic-optical disks, read-only memories (ROMs), random access memories (RAMs), electrically programmable read-only memories (EPROMs), electrically erasable and programmable read only memories (EEPROMs), magnetic or optical cards, any other type of media suitable for storing electronic instructions that are capable of being conveyed via a computer system bus.

The process(s)/module(s) (or counterpart terms specified above) and display(s) presented herein are not inherently related to any particular computer or other apparatus, unless specifically stated otherwise. Various general purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the inventions as described herein.

As was explained above, a wafer typically includes a plurality of dice. In a perfect world, each die in a wafer would comprise an identical integrated circuit. However, in the real world, individual dice in a wafer may in some cases vary from one another, for example in any of characteristics, performance, behavior, etc. Therefore testing is performed in one or more stages to separate the acceptable quality integrated circuits from the unacceptable quality integrated circuits. It is possible however, that a group of dice in a wafer can be assumed to resemble one another due to one or more criteria discussed below. For example, dice which are assumed (based on criteria discussed below) to have similar characteristics, performance, and behavior, may in some cases also be assumed to respond similarly to testing. The reader should understand that the assumption that the dice will respond similarly to testing is not infallible, however because the assumption is based on criteria, there is reasonability in the assumption. One or more representative dice are chosen to represent a group of dice which are assumed to respond similarly to testing. Herein below a representative die is termed "reference die". In one embodiment, data collected from the testing of reference dice is used in determining the testing of non-reference dice and/or for other purposes such as for example data collection purposes (also known as characterization tests), and/or test workflow determination.

In some embodiments, the criterion/criteria based on which a group of dice can be assumed to respond similarly to testing remain(s) constant across wafers and/or lots of the same product and/or of other products. In one of these embodiments, reference dice for the same product (and/or other products) may therefore be selected in a similar manner across more than one wafers/lots, in some cases throughout the product life cycle and/or across products.

Depending on the embodiment, in the description below the terms "die/dice" "reference die/dice" and non-reference die/dice, and similar terms may refer to the die/dice at one or more stages of the manufacturing process (fabrication and/or testing). For example depending on the embodiment, the stages may include inter-alia one or more of the following: the die/dice area at the wafer level, packaged die/dice, die/dice assembled into a system, etc. In one embodiment where there is full traceability between Sort and Final Test (via a die trace or unit level traceability technique where for example x-y coordinates are fused into each unit), the reference dice methods and systems described herein can be executed across all test sockets even after the wafer has been cut into units. The entire test chain can thus benefit from reference dice data.

Figure 1:
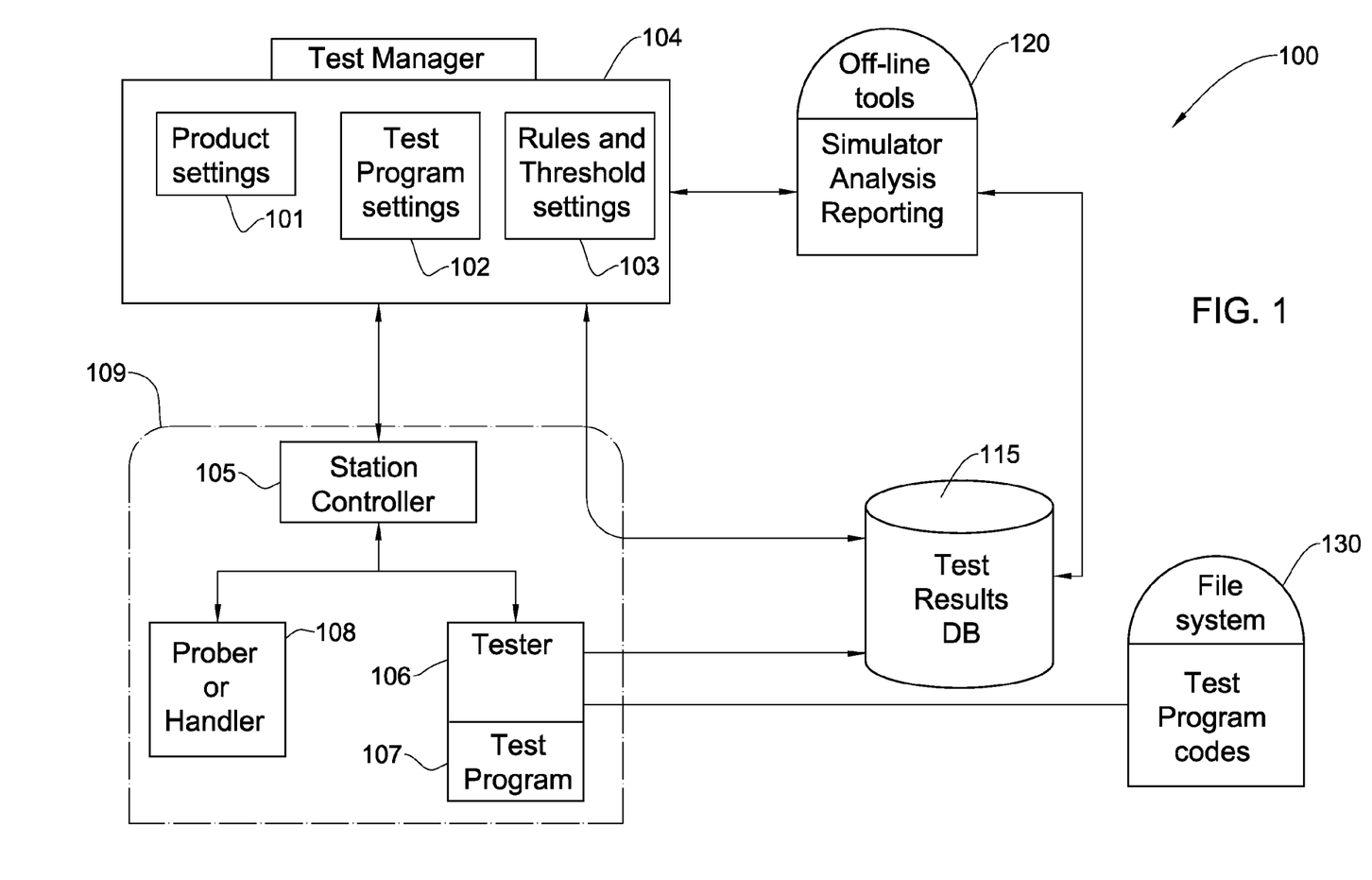
FIG. 1 is a block diagram of a system for semiconductor testing, using reference dice according to an embodiment of the present invention.

Attention is first directed to FIG. 1, illustrating a general system architecture 100 in accordance with an embodiment of the invention. Each module in FIG. 1 can be made up of any combination of software, hardware and/or firmware that performs the functions as defined and explained herein. The modules in FIG. 1 may be centralized in one location or dispersed over more than one location. In other embodiments of the invention, the system may comprise fewer, more, and/or different modules than those shown in FIG. 1. In other embodiments of the invention, the functionality of system 100 described herein may be divided differently into the modules of FIG. 1. In other embodiments of the invention, the functionality of system 100 described herein may be divided into fewer, more and/or different modules than shown in FIG. 1 and/or system 100 may include additional or less functionality than described herein.

As shown in FIG. 1, system 100 includes a test manager 104, offline tools 120, a test results database 115, a file system 130, and a test cell 109. Test manager 104, offline tools 120, test results database 115, file system 130 and test cell 109 in one embodiment are connected to one another via a local area network LAN.

As illustrated in FIG. 1, test manager 104 includes a product settings module 101, a test program settings module 102, and a rules and threshold setting module 103. Product settings module 101, for example, may include various product settings. In one embodiment, one of the product settings is a wafer map control that defines inter-alia the die locations on a wafer, the lithography exposures, and the E-test locations. In one embodiment the wafer map definition is per product. In one embodiment, product settings module 101 includes a selector tool (automatic and/or with user intervention) for selecting reference dice, the selection of which will be explained in more detail below.

Test program setting module 102, for example, includes one or more test program settings. In one embodiment test program module 102 include inter-alia the file and directory locations of actual test program code that a tester 106 uses in order to load the test program into memory. Additionally or instead test programs settings module 102 may include global variables for tests so as to allow appropriate actions to be performed as will be explained in more detail below.

Rules and threshold settings 103, for example, includes information on which tests should be executed as part of a given test flow (for example reference die test flow versus non-reference die test flow as will be explained in more detail below). Rules and threshold settings 103 may also or instead include threshold levels for activation of tests on non-reference dice, as will be explained in more detail below.

In one embodiment, offline tools 120 include inter-alia, an analysis tool, a simulator and/or reporting tool. In one embodiment, offline tools 120 are used for one or more of the following functions: analyzing results from earlier testing of dice in order to identify tests that can or should be added and/or removed from test flows (see description of stage 212 below), simulating activation criteria on past data (for example from previous testing) in order to quantify the impact of the activation criteria (for example on test time savings, parts per million budget, etc—see description of stage 214 below), and providing reports on the testing (for example how many wafers and/or lots were tested, how the wafers/lots were tested, and/or any other testing information).

As illustrated in FIG. 1, test cell 109 includes station controller or controllers 105, tester 106, and handling equipment 108. Herein, the single form of station controller SC 105 should be construed to refer to either single and plural station controllers, as appropriate. In one embodiment the various modules of test cell 109 are connected via a bus. In one embodiment, SC 105 comprises a conventional data processor.

As illustrated in FIG. 1, tester 106 incorporates a test program 107. In one embodiment test program 107 accommodates various test flows and is used to program and sequence tester 106 for testing the different populations of devices (reference and/or non-reference dice), where the testing of different populations will be explained in greater detail below.

In one embodiment, variables in test program 107 may be changed which affect for example the sequence of tests, the bins, test conditions/settings of one or more tests, etc, thereby changing how test program 107 is executed. In one embodiment test program 107 includes "switches" or globals (variables) inside which are accessible by SC 105 so that the variables can be switched if necessary from default values, based on instructions from test manager 104. Depending on the embodiment, the test program of the current socket and/or of one or more other sockets may be changed. As will be explained below, in some cases changes to test program 107 are determined based on reference dice data.

Handling equipment 108 includes in one embodiment a prober for handling a wafer and/or handler for handling an individual unit. A similar test cell can be used, for instance for the final stage test, wherein the handling equipment 108 includes a device handler adapted to handle packaged devices. In other embodiments, handling equipment 108 may also or instead include other equipment used to handle wafers or packaged integrated circuits.

In other embodiments, test cell 109 can include instead or in addition other modules. For example in one of these other embodiments, test cell 109 is a burn in cell including for example station controller 105 and a burn in oven incorporating tester 106.

In some embodiments, file system 130 holds the actual test program codes. In one of these embodiments, file system 130 is a centralized file system including all test program codes, and one or more testers 106 (i.e. from different test cells 109) interface with file system 130, for example via a local area network LAN. For example, tester 106 can load the appropriate test program 107 from file system 130 during setup, with the path for the appropriate test program 107 defined for example in test program settings 102. In other embodiments, centralized file system 130 may be omitted from system 100 because test program code is directly placed on individual testers 106, for example on the individual tester computer drives.

In some embodiments, tester 106 or another service places test results in a consolidated test results database 115. In other embodiments test results are dispersed over more than one database 115, for example which are associated with individual testers 106. Offline tools 120 access and make use of test results from database 115, for example accessing database 115 via a local area network.

Figure 2:
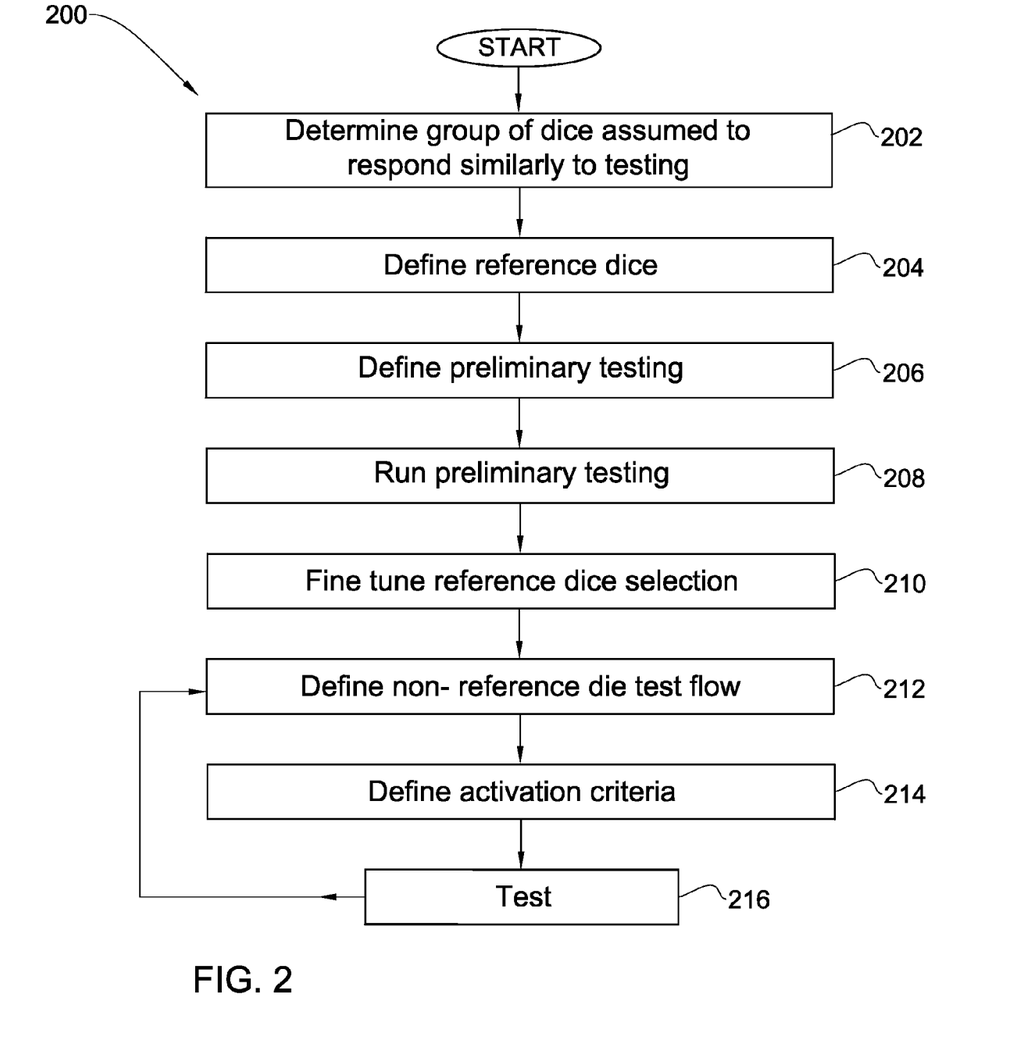
FIG. 2 is a flowchart of a method for semiconductor testing using reference dice, according to an embodiment of the present invention.

Refer to FIG. 2, which shows a flowchart of a method 200 for semiconductor testing using reference dice, according to an embodiment of the present invention. In other embodiments of the invention, fewer, more, or different stages than those shown in FIG. 2 may be executed. The stages may be executed in a different order than shown in FIG. 2 and/or in some embodiments one or more stages may be executed simultaneously. Each of the stages of method 200 may be executed automatically (without user intervention), semi-automatically and/or manually.

It is assumed that prior to testing, the wafer map control in product settings 101 is available and therefore the die locations on a wafer, proximity neighbors, lithography exposures and E-test locations are available. Geographies such as rings may in some embodiments also be known prior to testing based on previous process knowledge from similar products. However, in some embodiments, defining rings prior to testing a new product which has been fabricated using a new process may be more difficult than for a known process because the characteristics and/or behaviors of rings may in some cases be process dependent. For example the width (radius) or amount of rings may vary from one fabrication process to another and in order to determine the widths of the rings, testing may in some cases be required. Stages 202 and 204 described below are performed in one embodiment prior to testing, for example in product settings module 101 and/or other module(s) of system 100.

In stage 202, a determination is made of which dice in a wafer can be assumed to respond similarly to testing. Depending on the embodiment there may be any number of groups of dice in a wafer, where each die in a given group can be assumed to respond to testing similarly to the other dice in the given group. In one embodiment, two dice from two different groups are less likely to respond similarly to testing than two dice from the same group, whereas in another embodiment there may in some cases be a group of dice which are assumed to respond similarly to another group of dice. It should be evident to the reader that in some embodiments there may not necessarily be one correct way of grouping, and that more than one way of grouping dice may be acceptable. The criteria for grouping which dice can be assumed to respond similarly to testing is not limited by the invention, however for the sake of further illumination to the reader, some examples of possible criteria will now be described.

Figure 3:
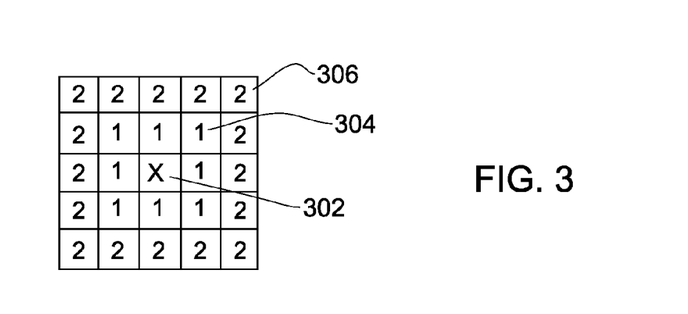
FIG. 3 is an illustration of proximity neighbors, according to an embodiment of the present invention.

For example in one embodiment, neighbors in proximity to one another geographically on a wafer may be assumed to respond similarly to testing. This assumption of similar response may be based on the assumption that because neighbors in proximity were fabricated similarly, the neighbors in proximity should also behave similarly and respond similarly under testing. The degree of proximity may be any suitable proximity, for example one die, two die, radius (distance from a die), etc. For example refer to FIG. 3 which shows proximity neighbors of die x 302, according to an embodiment of the current invention. In FIG. 3 there are shown which dice are level 1 proximity neighbors, i.e. one die away (one of which is labeled 304) and which dice are level 2 proximity neighbors, i.e. two dice away, (one of which is labeled 306) to die x 302.

In order to describe other possible criteria for grouping dice which can be assumed to respond similarly to testing, assume a plurality of lithography exposures in one wafer. As is known in the art, lithography is the process of imprinting patterns on semiconductor materials to be used as integrated circuits. During the lithography process masks are used to expose at least one die at a time, where the exposure is replicated again and again across the surface of a silicon wafer. The mask is usually product specific. If the mask includes more than one die, then more than one die is included in the same exposure.

Figure 4:
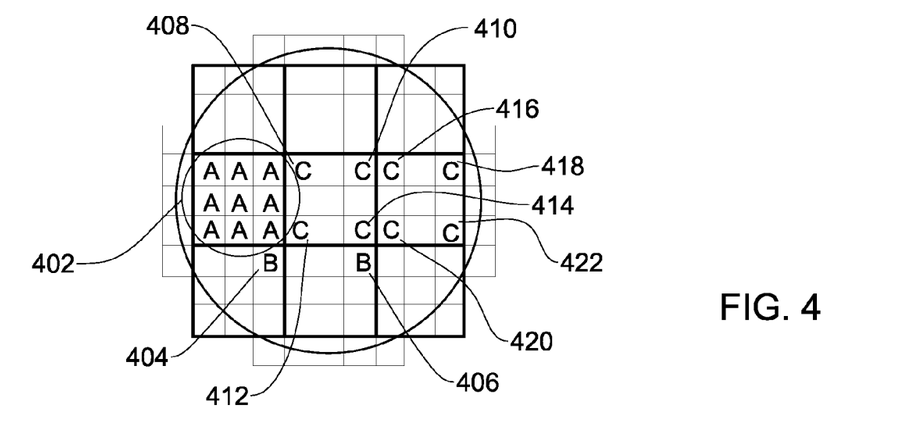
FIG. 4 is an illustration of lithography exposure, according to an embodiment of the present invention.

Refer to FIG. 4, which illustrates lithography exposures, according to embodiments of the present invention. In FIG. 4, each lithography exposure (in the illustration including nine dice each) is shown bounded with thicker lines. In one embodiment, the dice in a single lithography exposure may be assumed to respond similarly to testing due to the common exposure, for example group 402 of dice marked A.

In another embodiment, the dice in the same position across a plurality of exposures may be assumed to respond similarly to testing, for example due to the mask design used in the fabrication process. For example in FIG. 4 dice B 404 and dice B 406 which are in the same position across exposures may be assumed to respond similarly to testing, and likewise dice C 408, 410, 412, 414, 416, 418, 420, and 422 may be assumed to respond similarly to testing. Note that in FIG. 4, dice C are also distinguished by being dice that are in the outer portion of each exposure. The reader will understand that the positioning of the reference dice within an exposure is not limited by the invention. As another example, if the reticle mask, creating a lithography exposure, creates 25 dice at each exposure and there is a minor defect at one of the corners, the minor defect may create a signature that can be observed in a specific pattern, for example repeated bad die RBD.

Another example of geographical criteria which can be used to group together dice which are assumed to respond similarly to testing is based on wafer rings. During semiconductor fabrication, it is possible that wafers are treated in one or more chemical processes. For example some of the chemical processes may involve gases while others may involve liquids. Continuing with the example, during different fabrication operations, the liquids/gases may be applied to the wafer in an appropriate form, for example from above the wafer (e.g. liquid) or from the sides (e.g. gas). In many cases, different areas on the wafer will receive different amounts of gases/liquids. As another example, during fabrication, electrons may be thrown at the wafers. Different areas of a wafer may receive different doses of the electrons. Because of the round characteristic of the wafer, each differentiated area of the wafer (differentiated from other areas for example in doses of gases, liquids, and/or electrons) may in some cases be observed on the wafer as a circular ring, where the dice in a given circular ring are assumed to react similarly to testing.

There are different options for defining the boundaries of the rings, and the definition of rings is not limited by the invention. However for the sake of further illumination to the reader, some options will now be described. In one embodiment, each ring has an equal radius (where the radius for the innermost ring is from the center to the innermost ring, and the radius for any other ring is from the nearest inner ring to that other ring). In this embodiment, the innermost ring will have the fewest dice, and as the rings proceed outward, the number of dice in each ring becomes progressively higher. In another embodiment, each ring has the same number of dice, and therefore the innermost ring will have the largest radius, and as the rings proceed outward, the radius of each ring becomes progressively smaller.

Figure 5:
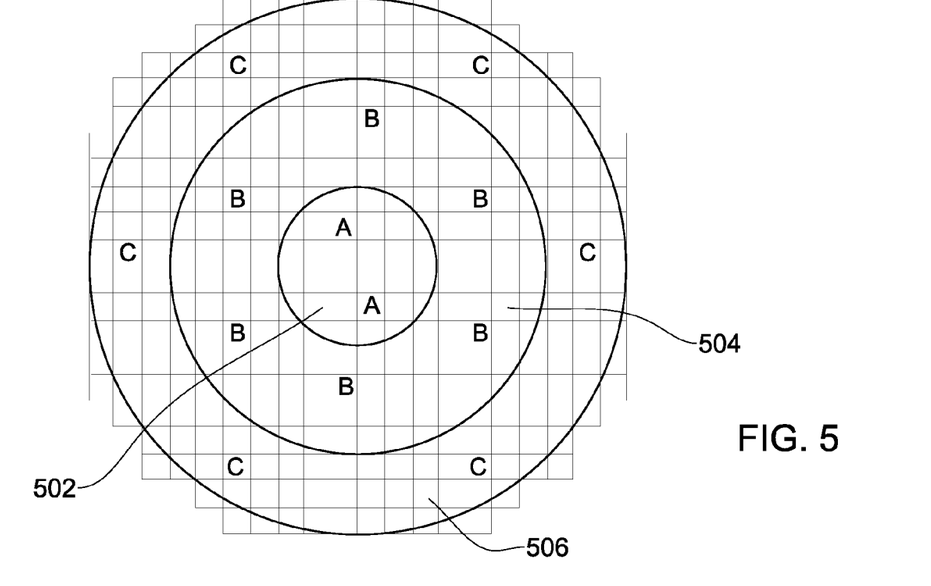
FIG. 5 is an illustration of wafer rings, according to an embodiment of the present invention.

Refer to FIG. 5 where geographical rings 502, 504 and 506 are illustrated. This figure illustrates an embodiment where each ring is of equal radius. It is assumed that dice in ring 502 would react similarly to testing, dice in ring 504 would react similarly to testing and dice in (edge) ring 506 would react similarly to testing.

Any other reasonable criterion/criteria may instead or in addition be used for determining which dice can be assumed to respond similarly to testing.

In stage 204, from each group of dice which are assumed to respond similarly to testing one or more reference die is chosen, and/or one or more reference die is chosen to represent more than one group of assumed similarly responding dice. In one embodiment, each group of dice which are assumed to respond similarly to testing has at least one reference dice chosen from it, whereas in another embodiment there may be groups of dice (which are assumed to respond similarly to testing) from which no reference die is chosen. As an example of the latter embodiment, suppose only a certain percentage of dice may be selected as reference dice, then in this case a group with lower priority may not have a reference dice representative. As another example of the latter embodiment, suppose there are more than one algorithm for grouping dice and selecting reference dice, then the strongest algorithm may be used to select reference dice causing groupings in accordance with weaker algorithms to not have representative reference dice.

Assume for the sake of simplicity of description of stage 204 that at least one reference die is selected from each group of dice assumed to respond similarly to testing. In one embodiment, the at least one reference die is chosen randomly from the group. In another embodiment, the at least one reference die is chosen at least partially according to predetermined criteria. The criteria used for selecting reference dice are not limited by the invention, however for the sake of further illumination to the reader, some examples of possible criteria will now be described.

For example, reference dice may be selected based on position in a group of dice which are assumed to respond similarly to testing, selected based on distance from neighboring reference dice in the group, and/or the number of chosen reference dice may be a function of the total number of dice in the group. Referring again to FIG. 5, assuming that the entire outer ring 506 includes dice which are assumed to respond similarly to testing, in one embodiment six dice (marked "c") may be chosen as reference dice. Similarly six dice (marked "B") are shown as chosen as reference dice for ring 504, and two dice (marked "A") are shown chosen as reference dice for ring 502. In the illustration, the distance between each pair of neighboring reference dice in a group is similar. The reader will understand that there is no limitation in this invention on the number of rings, the number of reference dice chosen from each ring, and/or the position of the reference die/dice in a ring.

As another example, assuming that dice are assumed to respond similarly to testing if the dice are in the same exposure on the wafer and/or in the same ring on the wafer, then one or more reference dice can be selected from each exposure, one or more reference dice can be selected from each ring, and/or one or more reference dice which are included both in a same exposure and in a same ring may be selected (for example for each combination of exposure/ring).

In some embodiments, assuming that the grouping in stage 202 grouped together dice which can be assumed according to certain criteria to react similarly to testing, the selection of reference dice to represent a group may take into account subgroups within the group which according to other criteria may be assumed to react differently to testing. The type and number of subgroups taken into account are not limited by the invention but for the sake of further illumination to the reader, some examples are now presented. For example, assume that dice in the same ring have been grouped together in stage 202 because those dice are assumed to respond similarly to testing. Reference dice representing the ring may be selected from each lithography exposure, from different positions in a lithography exposure, and/or which are not proximity neighbors, in order to provide representation of various subgroups which may possibly react differently to testing. As another example, assuming that dice have been grouped together in stage 202 which are in proximity to one another and therefore assumed to react similarly to testing, reference dice can be selected from the group which are in different rings, in different positions in an exposure, and/or which are from different exposures, in order to provide representation of various subgroups which may possibly react differently to testing. As another example, if dice have been grouped together in stage 202 based on lithography (for example in the same exposure or in the same position across exposures), reference dice can be selected based on geography considerations (for example dice from different rings and/or dice which are not proximity neighbors), in order to provide representation of various subgroups which may possibly react differently to testing.

Figure 6:
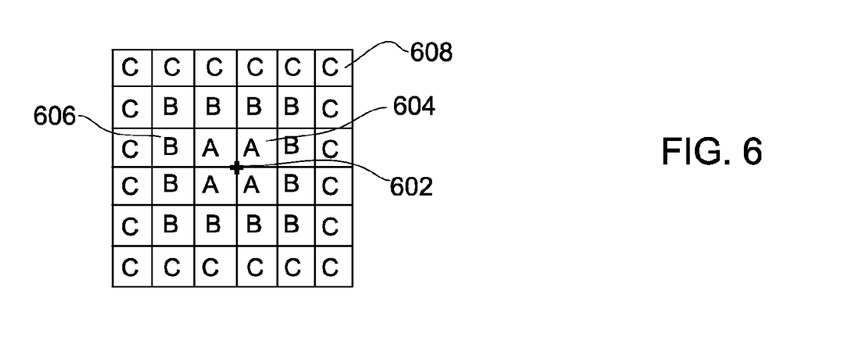
FIG. 6 is an illustration of an E-test structure and surrounding dice, according to an embodiment of the present invention.

In some embodiments the selected reference dice facilitate data analysis and correlation. For example, if within the group of dice which are assumed to respond similarly to testing, one or more dice are located near E-test structures, in one of these embodiments the reference die/dice for the group can be chosen from among the dice located near the E-test structure. Continuing with the example, refer to FIG. 6, which shown an E-test structure 602 according to an embodiment of the present invention. In FIG. 6, E-test structure 602 is shown as a plus sign. The characteristics of any of dice A (one of which is identified as 604) can be assumed to correlate better with the E-test structure than any of dice B (one of which is identified as 606) which in turn can be assumed to correlate better with the E-test structure than any of dice c (one of which is identified as 608). Assuming the reference dice undergo more extensive testing, then in order to take advantage of the extra information known on the reference dice, in this example it would be advantageous to position the reference die/dice as any of dice A rather than any of dice B or C so that data analysis and correlation between E-test, and for example Sort parameters can be more comprehensive.

In other embodiments, the selected reference dice may be selected based on an assumption about which geography in a wafer is more likely to exhibit a lower yield. For example in one of these embodiments it may be assumed that edge dice (dice in the outer ring) on a wafer will have lower yield than dice in the center of the wafer. Therefore, in this example reference dice which are edge dice may be chosen when possible from among the dice which are assumed to respond similarly to testing. The geography/ies in a wafer which is/are assumed to be low yielding is/are not limited by the invention.

Depending on the embodiment, out of the dice which are assumed to respond similarly to testing there may be one or more dice that may be suitable as the reference die/dice and in some embodiments any of the dice which are suitable as reference die/dice may be selected as the reference die/dice. The invention is not limited by how the reference dice are selected.

Since each reference die is chosen as representative of a group or groups of dice which are assumed to respond similarly to testing, it is likely that in some cases the selected reference dice as a whole are more representative of the population of dice undergoing testing, than if dice were selected as representatives randomly or on a statistical basis from the population undergoing testing without regard to which groups of dice can be assumed to respond similarly to testing.

In one embodiment, for example if a product does not have unit level traceability the selected reference dice can be used for a limited number of test sockets, for example the E-test and Sort test sockets. In another embodiment, for example if the product has unit level traceability, the selected reference dice can be used for all test sockets, including inter-alia: E-test, Sort, Burn-in, Final Test, and System Validation.

In one embodiment, the selected reference dice remain as reference dice across a plurality of wafers and/or lots of the product and in some cases even throughout the remainder of the life cycle of the product (i.e. subsequent to the selection of the reference dice), unless changes become desirable or necessary.

In another embodiment the groupings and/or the reference dice may be updated, for example if later it appears that other groupings are more appropriate and/or other dice are more appropriate as reference dice, and/or for any other reason. The update can occur, for example, in stage 210 (see below).

The position of each reference die may be identifiable in one embodiment by the x-y coordinates of the reference die in the wafer. As mentioned above, in some cases the x-y coordinates may be fused into a unit so that even when the die is no longer in wafer form, the (past) x-y coordinates of the die may be known.

In stage 206, the preliminary tests, test conditions, and/or sequence of tests are defined. In one embodiment, the reference die test flow and the non-reference dice test are defined to be identical during preliminary testing. In other embodiments, the reference die test flow and non-reference die test flow may be defined to be different during preliminary testing. For example, in one of these other embodiments the reference die test flow and the non-reference die test flow both include all pass/fail (aka failure identification) tests for the product but the reference die test flow also includes non pass/fail tests, for example design validation tests and/or data collection tests. Depending on the embodiment and particular test, a particular pass/fail test may provide only a pass/fail indication or may also provide numeric results. Pass/fail tests which also return numeric results are called herein below parametric tests.

The definition of the preliminary tests, test conditions and/or sequence of tests are performed in one embodiment by offline tools 120. The actual formation of the preliminary test flow(s) (and/or removal of tests from the test flow(s)) is performed in one embodiment in test program settings 102 and test program 107. In one embodiment, if different test flows are defined for preliminary testing of reference dice and non-reference dice, then the actual formation of test flow(s)/removal of tests in stage 206 is also executed in rules and threshold settings 103. In other embodiments, stage 206 may be performed in addition or instead in other module(s) of system 100.

In stage 208, the preliminary testing as defined in stage 206 is run on a limited number of wafers and/or lots in order to establish a baseline. The number of wafers and/or lots undergoing the preliminary testing may vary depending on the embodiment. In one embodiment, for sort socket and/or E-test testing, the preliminary testing can be done on a limited number of wafers and/or fabrication lots. Provided there is die traceability, the preliminary testing for burn in socket, final testing and/or system validation can be done on a limited number of assembly lots and/or fabrication lots.

In an embodiment where the defined reference die test flow is different than the defined non-reference test flow for preliminary testing, a die may be identified or not identified as a reference die, for example by x-y coordinates. The preliminary testing of stage 208 can in this embodiment follow for example method 700, described below, with stage 730 omitted because no adjustment of the non-reference die test flow occurs during the preliminary testing. In an embodiment where the defined reference die test flow and non-reference die test flow are the same, then the preliminary testing of stage 208 can include for example stages 702, 704, 710 (where in this case the test flow is the same for both reference and non-reference dice), 712, 714, 716, and 718, described below with reference to FIG. 7.

The baseline established in stage 208 may be useful, depending on the embodiment, for design, yield, quality and reliability, testing (including test time reduction), and/or operational excellence. The baseline includes in one embodiment a fallout distribution which shows how many times each failure identification test failed during the preliminary testing.

In one embodiment, the preliminary testing is performed in test cell 109, with the results captured in test results database 115 so that the results can be used by offline tools 120. In other embodiments, stage 208 may be performed in addition or instead in other module(s) of system 100.

Figure 10:
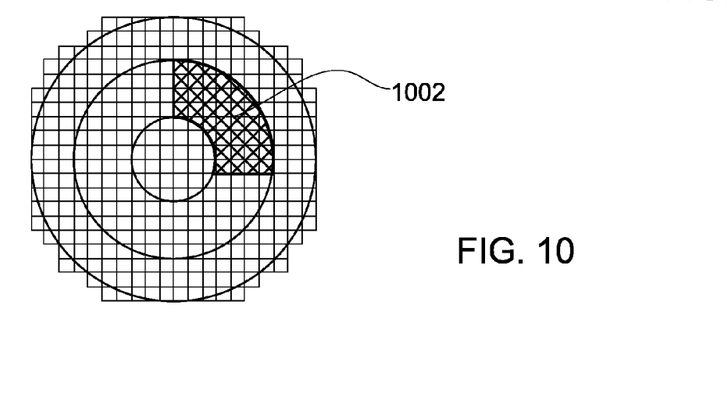
FIG. 10 is an illustration of a 3 o'clock signature, according to an embodiment of the present invention.

In optional stage 210, the selection of reference dice and/or the grouping of dice which are assumed to react similarly to testing may be fine tuned based on the preliminary testing. For example the reference dice selection may be adjusted to accommodate high failure areas. Continuing with the example, if within the group of dice which are assumed to respond similarly to testing, one or more dice are located in areas of high failure based on yield analysis data from the preliminary testing, in some embodiments, one or more reference dice can be chosen from among the dice located in areas of high failure, in order to ensure representation of the problematic areas and/or to monitor the problematic areas. In some of these embodiments, fabrication process variations may have caused dice to either malfunction or have marginal operating characteristics, resulting in certain geographies over the wafer exhibiting different yields. Dice located in such low yielding geographies are therefore more likely to be subject to reliability problems. In one of these embodiments, any closed region on a wafer may be determined to be a high failure area. Refer for example to FIG. 10 which shows a 3 o'clock signature 1002. In one embodiment, section 1002 may be determined to be a high failure area and reference dice may be adjusted so that one or more reference dice are chosen from that section. The region(s) on a wafer which is/are determined to be low yielding is/are not limited by the invention.

As another example, if rings may be defined or redefined based on the preliminary testing, then in one embodiment the grouping together of dice which are assumed to respond similarly to testing may in some cases be adjusted in stage 210 in order to take into account the ring definition or redefinition.

Stage 210 may be performed in one embodiment in product settings 101 and/or other module(s) of system 100.

In stage 212, the test flow for testing non-reference dice after the preliminary testing is defined. In one embodiment, the test flow(s) for testing reference dice remain as defined in stage 206 whereas in another embodiment, one or more of the test flow(s) for reference dice may be defined in stage 212. As an example of the latter embodiment, data collection tests which were not included in the reference die test flow in preliminary testing may be added to the reference die test flow in stage 212. Depending on the embodiment, the non-reference die test flow may be defined in any appropriate manner. For example in one embodiment, a non-reference die test flow is defined separately from the reference die test flow. In another embodiment, there is a single reference die test flow and tests that are in the reference die test flow but not in the non-reference die test flow are defined in stage 212 so that these tests can be turned off for non-reference dice (unless reactivated). It should be evident to the reader that in either case, the same test flow is applied to non-reference dice, but for ease of explanation it is assumed below that the non-reference die test flow is separately defined.

For example, in some embodiments the non-reference die test flow may include less tests than those prescribed for reference dice and/or different tests. Continuing with the example, assume that there is a parts per million PPM budget which limits the allowed number of dice that have passed testing at a given socket but fail at later sockets (and/or after delivery to customer). As the reader will understand, the higher the PPM budget, the more test time reduction TTR can be achieved. It is desirable to remove as many tests from the non-reference test flow as possible to achieve high test time reduction but because pass/fail tests catch problem dice, at least some of the pass/fail tests may need to be retained in the non-reference die test flow so as to not exceed the PPM budget. In one of these embodiments, using the baseline determined in stage 208, certain pass/fail tests are retained in the non-reference die test flow while others are removed. For example, if the baseline included a fallout distribution, in one of these embodiments, pass/fail tests which failed up to a certain number of times (where the limit can vary depending on the PPM budget) may be removed from the non-reference die test flow. As another example, if the numeric results from a particular parametric test are far in terms of standard deviation and/or other statistical criteria from a test limit, the particular parametric test may in one embodiment be removed. Note that in one embodiment, the tests which have been removed from the non-reference die test flow are still retained in the reference die test flow for monitoring and control purposes, and activation criteria are set (see below stage 214) which in some cases may be advantageous over removing tests completely (i.e. not testing any dice with those tests).

In one embodiment, tests which are used primarily for data collection and not used for failure identification (i.e. data collection tests do not have pass/fail criteria) may be among the tests in the reference dice test flow but not part of the non-reference die test flow. The results from data collection tests may in some cases be reviewed, for example offline by an engineer, and used to improve the fabrication process, to improve the testing process, for yield enhancement, etc. Typically although not necessarily, data collection tests are time consuming so limiting the execution of one or more of these tests to reference dice may in some cases result in non-negligible test time reduction.

As another example, all tests available to test manager 104 may be part of the reference dice flow, whereas less than all available tests may be part of the non-reference die test flow. As another example, in one embodiment more tests that are available to test manager 104 may be part of the reference dice flow than part of the non-reference die test flow.

In some embodiments, a test that is part of a non-reference test flow may be different (modified) than a test that is part of the reference die test flow. In some of these embodiments the test in the reference die test flow may be more rigorous than the test in the non-reference die test flow. In one of these embodiments, the accuracy level demanded for the test may be higher in the reference die test flow than in the non-reference die test flow in order to collect additional information. For example, in a maximum frequency search test, the accuracy required for the result can be different for non-reference dice and reference dice.

Difference(s) between the reference die test flow and the non-reference die test flow are not limited by the invention and in other embodiments, the reference die test flow and non reference die test flow may differ in less, more, and/or other ways.

In some embodiments, stage 212 may also include a definition of the default test workflow, including for example which sockets are performed and how testing at the various sockets is performed, unless changes are triggered.

The definition of the non-reference die test flow, the TTR analysis versus PPM budget (and/or optionally the definition of the reference die test flow), and/or the definition of the default test workflow are performed in one embodiment by offline tools 120. The actual removal of tests from the non-reference die test flow and/or the formation of the non-reference test flow (and/or optionally the reference die test flow, and/or optionally the test workflow) is performed in one embodiment in test program settings 102 and test program 107. In other embodiments, stage 212 may be performed in addition or instead in other module(s) of system 100.

In stage 214 activation criteria based on reference dice data are defined and/or the consequences of meeting and/or not meeting the activation criteria are defined. In some embodiments if the activation criteria are met, tests which are in the reference die test flow but not in the non-reference die test flow are activated for the same socket. In some of these embodiments, some of the tests may never be activated in the non-reference die test flow, for example in some cases tests primarily for data collection may never be activated. In some of these embodiments, pass/fail tests (including in some cases parametric tests) which are excluded from the non-reference die test flow may be activated (i.e. added to the non-reference die test flow) if the testing on the reference dice warrants the activation. In some embodiments activation criteria based on reference dice data can determine whether and how subsequent processing is conducted (i.e. can impact on the test workflow), affecting subsequent handling of reference and/or non-reference dice for example offline and/or in testing sockets.

Figure 7:
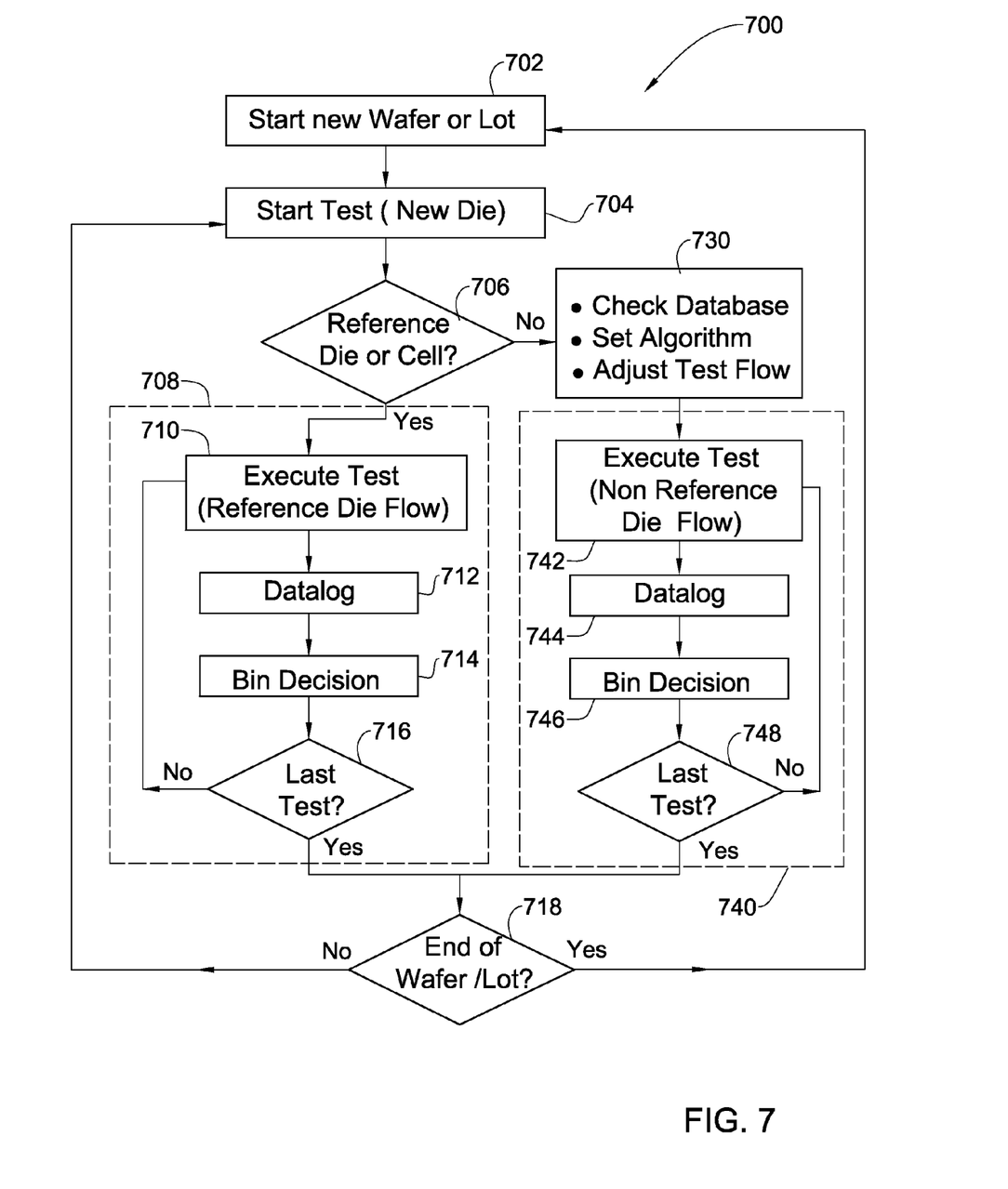
FIG. 7 is a flowchart of a method for executing the appropriate test flow during semiconductor testing, according to an embodiment of the present invention.

The activation criteria are not limited by the invention, but for the sake of further illumination for the reader some examples are now presented. For simplicity sake the examples are provided in the context of affecting the real time testing of non-reference dice in the same socket, but it should be evident that similar examples can be applied in the context of subsequent processing, mutatis mutandis. For example, the activation criteria for a given test may be set so that if at least a predetermined number (threshold) of reference dice in a wafer and/or lot (statistical bin limit SBL rule) failed the given test, the test is added back to the non-reference die test flow (see stage 730 of method 700 for more details). As another example, in one of these embodiments, the activation criteria for a certain test is set so that if at least a predefined number (threshold) of sequential reference dice in a wafer and/or lot (consecutive bin limit CBL rule) failed the certain test, the test is added back to the non-reference die test flow (see stage 730 of method 700 for more details). In some embodiments, the predefined number of failures for a test is set while taking into account the baseline established in stage 208. For example, in one of these embodiments, a first test which during the preliminary testing failed less times than a second test may have the predefined number set lower (tighter) than the predefined number for the second test, so as to catch deviation from the baseline. As another example, if the baseline established in stage 208 shows that the failure of a particular test is "less harmful" than the failure of another test (for example, less likely to mean that other dice in the wafer/lot also have failed, less likely to affect the performance of the final product from the die, etc) than the predefined number for the less harmful test may be set higher than for the more harmful test.

As another example, in some embodiments the activation criteria for a given test may be based on parametric test results of the reference die test flow. In some of these embodiments, for example, the decision on whether to activate a particular test in the non-reference die test flow is based on an analysis of statistical parameters derived from the results of the testing on reference dice. Continuing with the example, in one of these embodiments, if the spread of the results (for example the standard deviation) is larger than a predetermined level (threshold), the test is activated. Depending on the embodiment, activation criteria for a test which are based on analysis of statistical parameters may be instead of or in addition to activation criteria that are based on whether a predefined number of reference dice (or sequential reference dice) in a wafer and/or lot failed the given test. For example in one embodiment, a test is activated if at least a predefined number fail or if a predefined number did not fail but the spread of the results were larger than a predetermined level.

As explained above, each selected reference die represents other dice which can be assumed to respond similarly to testing as explained above. Therefore, the testing of reference dice using the reference die test flow is in some cases more accurately representative of the population undergoing testing than if, say, a statistical sample of dice had been selected for additional/more rigorous testing from among the dice in a wafer and/or lot without regard to whether the response to testing of dice in the sample are actually representative of the response to testing of the population. For this reason, in some embodiments, it is considered suitable for the activation criteria for tests in the non-reference dice test flow to be based at least partly on the testing results for the reference dice.

Stage 214 is one embodiment is performed in rules and threshold settings 103. In some cases, the activation criteria may be simulated by offline tools 120 using for example the preliminary test results. In other embodiments, stage 214 may be performed in addition or instead in other module(s) of system 100.

In stage 216, testing is performed as will be explained in more detail with reference to method 700 of FIG. 7. In one embodiment, the testing is performed in test cell 109 and/or in other module(s) of system 100.

Optionally, in one embodiment once a predefined number of lots and/or wafers have been tested, once a predefined testing period has passed, and/or based on any suitable criteria, method 200 may loop back to stage 212, to redefine the non-reference die test flow, the test workflow and/or activation criteria. For example, a new baseline can be established based on the results of the testing in stage 216 and/or the preliminary testing of stage 208, where the baseline can include for example an updated fallout distribution. Continuing with the example, using the new baseline, a new analysis of which tests should be included in the non-reference die test flow may be conducted and/or new activation criteria may be defined. At this stage, it is possible that the newly defined non-reference die test flow may include the same tests, more tests, less tests, different tests, more rigorous tests, and/or less rigorous tests than the previously defined reference die test flow. Similarly at this stage, it is possible that the new activation criteria may be the same, more strict, less strict, or different than the previously defined activation criteria.

In another embodiment, there is no loop back and testing in stage 216 continues for all future wafers and/or lots using the previously defined reference die test flow, test workflow, and activation criteria.

In other embodiments, once a predefined number of lots and/or wafers have been tested, once a predefined testing period has passed, and/or based on any suitable criteria, method 200 may loop back to stage 210, to further fine tune the reference dice selection and/or the grouping of dice which are assumed to respond similarly to testing. The further fine-tuning may take into account results of the testing in stage 216 and/or the preliminary testing of stage 208, depending on the embodiment. In these embodiments, after the repetition of stage 210, the method may proceed with stages 212, 214, and 216, or may continue directly to testing in stage 216.

Refer to FIG. 7 which is a flowchart of a method 700 for executing the appropriate test flow during semiconductor testing, according to an embodiment of the present invention. In other embodiments of the invention, fewer, more, or different stages than those shown in FIG. 7 may be executed. The stages may be executed in a different order than shown in FIG. 7 and/or in some embodiments one or more stages may be executed simultaneously. Each of the stages of method 700 may be executed automatically (without user intervention), semi-automatically and/or manually. For example in one embodiment, method 700 is executed by test cell 109 and/or in other module(s) of system 100.

As mentioned above, depending on the embodiment, the same reference dice for a wafer and/or lot can be used across one or more test sockets. In one embodiment, method 700 is repeated each time a wafer and/or lot is tested in a different test socket.

Figure 8:
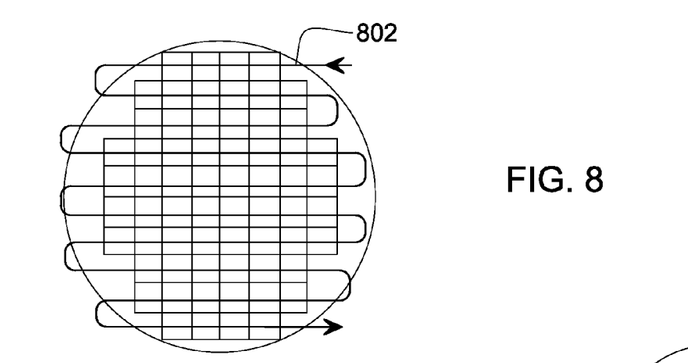
FIG. 8 is an illustration of a serpentine manner of testing, according to an embodiment of the present invention.

In stage 702, testing on a new wafer and/or lot begins. For example, in one embodiment, testing on a wafer can proceed in a serpentine manner through the dice. Refer to FIG. 8 which illustrates a serpentine line 802, according to an embodiment of the invention.

In stage 704, the testing on a new die in the wafer and/or lot begins.

In stage 706, the new die is identified as a reference die or a non-reference die, for example based on the known x-y coordinates of reference dice (and/or non-reference dice) within the wafer and/or lot. The x-y coordinates of reference dice and/or of non-reference dice may have been stored for example in product settings 101.

Assuming that the new die is identified as a reference die, a reference dice test flow 708 is executed on the die.

Figure 9:
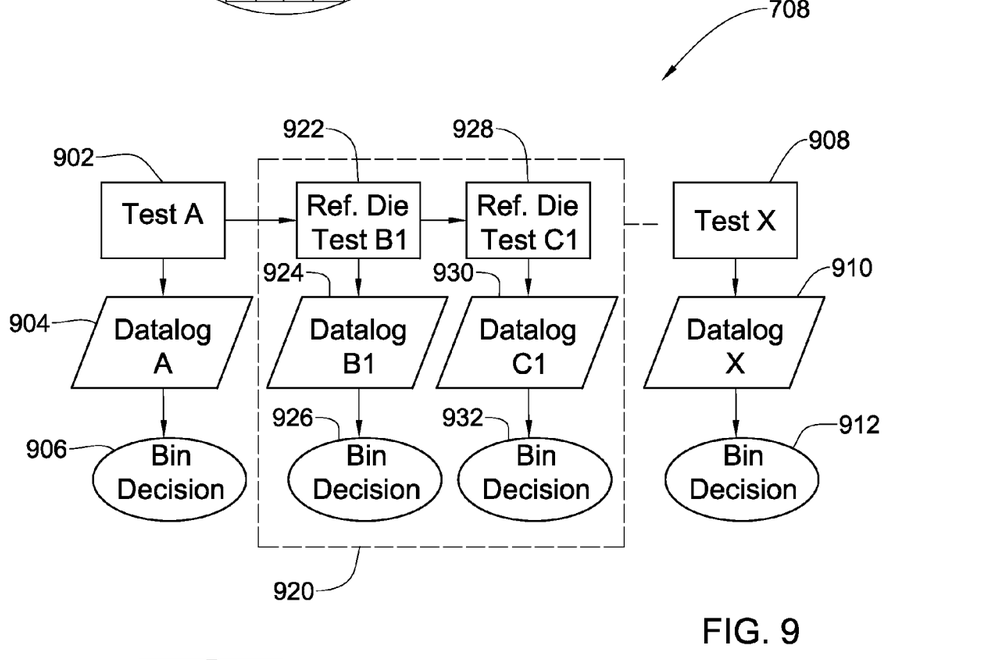
FIG. 9 is a flow diagram of a reference die test flow, according to an embodiment of the present invention.

Refer to FIG. 9 which shows one example of test flow 708 for a reference die, where reference die test flow 708 includes additional tests compared to a non-reference dice flow, according to an embodiment of the present invention. It is assumed for simplicity sake that the illustrated test flow includes failure identification tests. The reference die undergoes test A 902 and test X 908 which are also prescribed for non-reference dice. In addition, the reference die undergoes additional testing 920 which includes reference die test B1 922 and reference die test C1 928 which are not prescribed at that point in time for non-reference dice (although those tests may have been undergone in the past or may be undergone in the future by non-reference dice). Subsequent to each test there is a pass/fail indication collection of test results in a datalog and a binning decision. For example test A 902 is associated with datalog entry 904 and bin decision 906. The test flow illustrated in FIG. 9 is an example of a stop on fail test flow and in this illustration it is assumed that if a die fails a specific test, testing stops. If it is assumed that reference test flow 708 as illustrated in FIG. 9 comprises basic tests such as open/shorts, continuity, reset, etc, it may not be useful to perform any other tests if a die fails any of these basic tests because the other tests would likely also fail without providing any additional information. In other embodiments, testing may continue for example if a die fails any test, if a die fails one or more predetermined tests, and/or if a die fails less than a predefined number of tests.

Referring back to FIG. 7, a first test in the reference die test flow 708 is executed in stage 710, and then a datalog entry 712 and a bin decision 714 are made. If the test is not the last test, then stages 710, 712 and 714 are repeated for each test in the reference die test flow 708. When the last test has been applied (yes at stage 716), then if the last die in the wafer/lot has not been processed (no to stage 718) the next die is processed (stage 704). If the last die has been processed in the wafer/lot, then a different wafer/lot may be processed (stage 702), for example at the same or different testing socket, or the same wafer/lot can be processed (stage 702) for example at a different testing socket.

As mentioned above one or more reference die may have been selected per group(s) of dice which are assumed to respond similarly to testing. Assume more than one reference dice are selected from at least one group of dice which are assumed to respond similarly to testing. For example, assume a plurality of reference dice are selected to represent one group. In some embodiments, there may be more than one set of reference dice, with reference die/dice in each set distinguishable from one another for example via x-y coordinates on the wafer. In these embodiments, in stage 706, it is also identified to which set of reference dice the current reference die belongs, and the reference die test flow 708 corresponding to the set is applied. In one of these embodiments assuming there is a predetermined collection of potential tests which can be applied to the dice, different sets of reference die can undergo different reference test flows 708 (for example with different number of tests and/or different tests). For example, assuming two sets of reference dice, there may be 20 possible tests, with 10 out of the 20 tests (100%) being applied to non-reference dice, 15 out of the 20 tests (150%) being applied to one set of reference dice, and 20 out of the 20 tests (200%) being applied to a second set of reference dice. The number of sets of reference dice and the percentage of tests applied to each set are not limited by the invention. In some cases, the usage of more than one reference die test flow 708 (for different sets of reference dice) is advantageous compared to a single reference test flow in reducing test time while maintaining testing quality.

If instead in stage 706, the die is identified as a non-reference die (no in stage 706) then method 700 continues with stage 730.

In stage 730, it is determined if any real time adjustments to the non-reference die test flow as previously defined in stage 212 for the current socket are necessary.

To understand the added flexibility of method 700 in one embodiment of the invention, assume there is a test which did not fail in preliminary testing and was eliminated from the test flow for non-reference dice. The test however continues to be tested on reference dice. Assume further that the test is capable of catching fabrication failures which have not yet occurred but could potentially occur. If the test had been eliminated completely and not even tested on the reference dice, then if the failure later occurred it would not be caught. However if the test continues to be tested on the reference dice then appropriate reaction is possible, i.e. adjusting the non-reference die test flow if activation criteria are met.

The method of determining whether adjustments are necessary and/or the actual adjustments performed are not limited by the invention. However for the sake of further illumination to the reader, some examples will now be described.

In some embodiments it can be checked if the activation criteria for adjusting the current socket non-reference die test flow which were defined in stage 214 have been met, and if not, no real time adjustment to the non-reference die test flow in the current socket is made. If the activation criteria have been met then in some of these embodiments, adjustment is determined to be necessary and is performed. Adjustment can include in one of these embodiments adding back certain test(s) to the non-reference die test flow and/or modifying certain tests. For example, the tests which have met the activation criteria, additional tests in, all pass/fail tests additional stressing, additional parametric testing, and/or any other group of tests may in some cases be added back to the non-reference die test flow depending on the embodiment. For example, the tests which have met the activation criteria, other tests all pass/fail tests type of stressing, one or more parametric tests, and/or any other group of tests may in some cases be modified in the non-reference die test flow depending on the embodiment.

Assuming embodiments where certain tests are added back or modified, then depending on the embodiment, the tests may be added back or modified for any set of non-reference dice. For example the tests can be added back or modified for all non-reference dice in the wafer and/or lot where the activation criteria were met, for non-reference dice in the wafer and/or lot where the activation criteria were met which are assumed to react similarly to testing to the reference dice which caused the activation criteria to be met, and/or for any other set of non-reference dice. As another example, in some embodiments the test flow adjustment may carry over to other wafer(s) and/or lot(s) for the current socket. Continuing with the example, tests may be added back or modified in addition or instead for non-reference dice in one or more other wafers and/or lots, for non-reference dice in one or more other wafers and/or lots which are assumed to react similarly to testing to the reference dice which caused the activation criteria to be met, and/or for any other set of non-reference dice in other wafers and/or lots.

In some embodiments any anomaly in reference dice testing may in some cases trigger a flag and act as activation criteria for the non-reference die test flow. Continuing with the example, a comparison of the data for reference dice in the current wafer and/or lot with data from other wafers and/or lots can be performed in order to identify any differences in the current wafer and/or lot, including inter-alia any of the following: change in baseline, outliers, excursions, low yield, etc. The methods of comparison and/or the possible identifiable differences are not limited by the invention but for further illustration two examples are now given. For example, assume one or more statistical bin limit SBL rules running on the reference dice which are executed during testing of the wafer and/or the lot to check if a specific fail signature (bin, for example) is higher than normal (i.e. than for other wafers and/or lots). If the SBL rule is triggered, the test flow for non-reference dice is modified in one embodiment. As another example, assume one or more consecutive bin limit CBL rules running on the reference dice which are executed during the testing of the wafer and/or lot to check if a specific fail signature (bin, for example) is higher than normal (i.e. than for other wafers and/or lots). If the CBL rule is triggered, the test flow for non-reference dice is modified in one embodiment.

In some embodiments, the reference die test flow may include additional stressing compared to the non-reference die test flow defined in stage 212. Additional stressing can include for example additional duration and/or additional voltage. Depending on the embodiment the activation criteria for additional stressing may vary. For example, in one embodiment if it is determined that a predefined number of reference dice (or sequential reference dice) failed a post stress test, the non-reference die test flow may be adjusted in stage 730 to include additional stressing. As another example, analysis of statistical parameters derived from the results of the post-stress test on reference dice may cause the non-reference die test flow to be adjusted in stage 730 to include additional stressing. More information on stressing is provided in co-pending application Ser. No. 11/343,209, filed on Jan. 31, 2006, by Nir Erez and Gil Balog titled: Augmenting Semiconductor's Devices Quality and Reliability, details of which are incorporated by reference.

The determined test flow 740 (either as defined in stage 212 or as adjusted in stage 730) is executed, with a first test in the non-reference die test flow 740 executed in stage 742, a datalog entry 744 made and a bin decision 746 made. If the test is not the last test, then stages 742, 744 and 746 are repeated for each test in the non-reference test flow 1040. When the last test has been applied ("yes" at stage 748), then if the last die in the wafer/lot has not been processed ("no" at stage 748) the next die is processed (stage 704). If the last die has been processed in the wafer/lot, then a different wafer/lot may be processed (stage 702), for example at the same or different testing socket or the same wafer/lot may be processed (stage 702) at a different testing socket.

If testing is performed in a serpentine manner as illustrated in FIG. 8, then it may occur in some embodiments that the activation criteria are triggered only after one or more non-reference dice in a wafer and/or lot have already been tested. For example, this later triggering may in some cases occur in one of these embodiments if the activation criteria includes a predefined number of reference dice which failed a test, a predefined number of sequential reference dice which failed the test, and/or the activation criteria are based on the analysis of certain statistical parameters. In one of these embodiments, once the trigger has occurred, the already tested dice may be retested with an adjusted non-reference die test flow. In another of these embodiments, retesting of the already tested non-reference dice does not occur (and depending on the application, the already tested non-reference dice may be discarded or retained).

In an alternative embodiment to the method illustrated in FIG. 7 (where dice are processed according to the order of the dice in the wafer and/or lot) all reference dice in a wafer and/or lot may first be processed for a testing socket (i.e. repeating reference test flow 708 as many times as necessary) and only then non-reference dice in the wafer and/or lot are processed for the testing socket (i.e. repeating non-reference test flow 740, as defined in stage 212 or as modified in stage 730, as many times as necessary). In these alternative embodiments the serpentine line of FIG. 8 is not followed but in one of these alternative embodiments retesting previously tested non-reference dice is thereby avoided. Other sequences of processing the dice in the wafer and/or lot may be followed using similar methods and systems to those described here, mutatis mutandis.

In some cases, data can be leveraged from the reference test flow 708 of one or more sets of reference dice to define the reference test flow 708 executed on one or more different sets of reference dice. In this case, prior to the execution of reference test flow(s) 708 for the one or more different sets of reference dice, there will be a stage similar to stage 730 where it is determined if any real time adjustments to the corresponding reference test flow 708 are necessary based on data leveraged from the testing of other reference dice, using similar methods and systems to those described above, mutatis mutandis.

In one embodiment, in order for test cell 109 to execute as appropriate reference die test flow 708 or non-reference die test 740 (which may or may not have been adjusted in stage 730) and/or in order to execute an appropriate one out of a plurality of reference test flows 708, station controller 105 triggers certain actions by changing/maintaining the values of variables in test program 107. Examples of actions include any of the following inter-alia: Bypass/Execute a test, Change Upper/Lower Test Limit, Change Upper/Lower Search Limit, Change Force Value, Turn the Datalog On/Off, Update Test Flow, etc.

The Update Test Flow and Bypass/Execute test actions may be used to change the sequence of tests for reference and/or non reference dice. To better understand these actions, assume in one embodiment that there are a separate reference dice test flow 708 and a non-reference die test flow 740 which can possibly be executed on a given die in a wafer and/or lot. In one embodiment, station controller 105 may switch to the correct flow by providing an "update test flow" command to test program 107. In another embodiment, there may be only be a reference die test flow 708 and the non-reference die test flow 740 is made by switching off certain tests. The tests can be switched off (or on) by station controller 105 using the bypass (or execute) command. Similarly, if there are more than one reference die test flows, a correct reference die test flow can be applied using the update test flow and/or bypass/execute actions.

As another example, the change upper/lower test limit action may need to be implemented depending on whether the test is being applied as part of the reference die test flow 708 or non-reference die test flow 740 (and/or depending on which reference die test flow the test is a part of). In one embodiment the default upper/lower test limit for a test can be the upper/lower test limit for reference dice, and the upper/lower test limit for the test for non-reference dice can be set by station controller 105 by using the change upper/lower test limit command. In another embodiment the default upper/lower test limit for a test can be the upper/lower test limit for non-reference dice, and the upper/lower test limit for the test for reference dice can be set by station controller 105 by using the change upper/lower test limit command.

As another example, the change upper/lower search limit action may need to be implemented depending on whether the search is being applied as part of the reference die test flow 708 or non-reference die test flow 740 (and/or depending on which reference die test flow includes the search is a part of). In one embodiment the default upper/lower search limit can be the upper/lower search limit for reference dice, and the upper/lower search limit for non-reference dice can be set by station controller 105 by using the change upper/lower search limit command. In another embodiment the default upper/lower search limit for a test can be the upper/lower search limit for non-reference dice, and the upper/lower search limit for the test for reference dice can be set by station controller 105 by using the change upper/lower test search command.

As another example, the change force value action (for example changing the applied current or voltage) may need to be implemented depending on whether testing is being performed on a reference die or a non-reference die (or depending on which set of reference dice testing is being performed on). In one embodiment the default force value can be the force value for reference dice, and the force value for non-reference dice can be set by station controller 105 by using the change force value command. In another embodiment the default force value for a test can be the force value for non-reference dice, and the force value for the test for reference dice can be set by station controller 105 by using the change force value command.

As another example, the turn datalog on/off action may be used to turn on or off the datalog as appropriate when testing a die. Turning off the datalog can in some cases reduce test time. In one embodiment, the datalog may be turned off when testing non-reference dice.

In some embodiments, during the execution of method 700 in a particular socket, the test results for reference dice are used to determine whether activation criteria (defined in stage 214) have been met and subsequent processing (test workflow) should be changed. In these embodiments, the impact on subsequent processing may include affecting the testing of non-reference dice or may include affecting the testing of both non-reference dice and reference dice in the current wafer and/or lot. In some embodiments, the impact may also carry over to other wafer(s) and/or lot(s), affecting the test workflow of non-reference dice and/or reference dice in the other wafer(s) and/or lot(s). The impact on subsequent processing is not limited by the invention, but for the sake of further illustration to the reader, some examples are given. For example the decision can result in discarding, retaining and/or referring for user intervention/other processing one or more dice in wafer(s) and/or lots. As another example the decision can impact on whether a subsequent socket is performed or not and/or on whether the same (particular) socket is performed again. Continuing with the example, in one embodiment if a predefined number of reference dice in a wafer and/or lot (and/or predefined number of sequential reference dice in a wafer and/or lot) fail one or more predetermined tests, the failure can trigger inserting the current wafer/lot (and/or other wafers/lots) into an additional test socket (for example, Sort hot in addition to Sort cold). As another example the decision can impact on how a subsequent socket is performed, for example impacting on the sequence of tests and/or test conditions. Continuing with the example, in some embodiments, burn-in may normally be performed on a sampling basis on lots. In one of these embodiments, if a predefined number of reference dice (and/or predefined number of sequential reference dice) fail one or more predefined test, the failure can act as a triggering mechanism to perform burn-in on a non-sampling basis (i.e. on all dice) for the corresponding lot (and/or other lots).

In some embodiments, in order for test cell 109 to affect subsequent processing (test workflow related actions), station controller 105 changes or maintains the values of variables in test program 107. Examples of commands which may affect later processing include Resort, Retest, Hold, Scrap, Tag, etc. In one of these embodiments, workflow related information may be stored for example in a test database (identical or different to database 115) or in a workflow system.

For example, a lot and/or wafer can be tagged for a subsequent socket, for example to be processed differently in a subsequent socket and/or to be processed with additional sockets. In this manner the station controller 105 responsible for the other socket (which may or may not be the same station controller) or the workflow system can perform the correct processing.

As another example resort or retest can be used to cause one or more dice in a wafer and/or lot to undergo sort or other testing again. As another example, scrap can cause one or more dice in a wafer and/or lot to be discarded. As another example, hold can cause the future of one or more dice in a wafer and/or lot to be decided through other means, for example by a user or other processing.

In one embodiment of the invention, method 700 described herein allows the test flow for non-reference dice to be optimized on a die by die, individual package IC by individual package IC, wafer by wafer and/or lot by lot basis.

In one embodiment of the invention, the usage of reference dice allows test time reduction, for example through the elimination of certain tests from the testing flow for non-reference dice. In one embodiment of the invention, the usage of reference dice allows increased testing quality, for example due to the continuation of more aggressive testing on the reference dice, the careful selection of reference dice as described above, and/or the adjustment of testing when appropriate based on the reference dice testing results. Other advantages have been already indicated in the description above or will be apparent to the reader from the description above.

It will also be understood that the system according to the invention may be a suitably programmed computer. Likewise, the invention contemplates a computer program being readable by a computer for executing the method of the invention. The invention further contemplates a machine-readable memory tangibly embodying a program of instructions executable by the machine for executing the method of the invention.

While the invention has been shown and described with respect to particular embodiments, it is not thus limited. Numerous modifications, changes and improvements within the scope of the invention will now occur to the reader.

What is claimed is:

1. A method of semiconductor testing, comprising:
   identifying or not identifying a semiconductor die provided for testing as a reference die which had been previously selected as representative of a group of dice in a wafer that can be assumed to respond similarly to testing, wherein said group includes less than all dice in said wafer, and wherein less than all dice in said group had been previously selected as a reference die;
   if said die is identified as a reference die, testing said die with a reference die test flow; and
   if said die is not identified as a reference die, testing said die with a non-reference die test flow.

2. The method of claim 1, wherein there are a plurality of reference die test flows further comprising:
   recognizing said identified reference die as corresponding to one of said plurality of reference die test flows and wherein said testing with a reference die test flow includes testing with said corresponding reference die test flow.

3. The method of claim 1, wherein said testing said die with a reference die test flow includes applying a data collection test not included in said non-reference die test flow.

4. The method of claim 1, wherein said testing said die with a reference die test flow includes applying a failure identification test not included in said non-reference die test flow.

5. The method of claim 1, wherein said testing said die with a reference die test flow includes applying a test which is different compared to a test included in said non-reference die test flow.

6. The method of claim 1, further comprising:
   adjusting or not adjusting said non-reference die test flow based on data relating to reference dice, prior to testing said die not identified as a reference die.

7. The method of claim 6, wherein said data relating to reference dice includes a comparison between a failure rate for a test for reference dice compared to a predefined threshold.

8. The method of claim 7, wherein said comparison is between a number of reference dice which failed said test compared to a predefined threshold.

9. The method of claim 7, wherein said comparison is between a number of sequential reference dice which failed said test compared to a predefined threshold.

10. The method of claim 6, wherein said data relating to reference dice includes parametric test results.

11. The method of claim 6, wherein said adjusting includes adding at least one test to said non-reference die test flow.

12. The method of claim 6, wherein said adjusting includes changing at least one test in said non-reference die test flow.

13. The method of claim 6, wherein said adjusting includes additional stressing.

14. The method of claim 1, further comprising at least one selected from a group comprising: changing a test limit for a test, bypassing a test, executing a test, changing a search limit, changing a force value, turning a datalog on, turning a datalog off, updating a test flow, retesting, resorting, holding, scrapping, and tagging.

15. The method of claim 1, further comprising:
adjusting a test workflow based on data relating to reference dice.

16. A method of semiconductor testing, comprising:
determining a group of semiconductor dice in a wafer which can be assumed to respond similarly to testing, wherein said group includes less than all dice in said wafer; and
selecting at least one reference die from said group for testing differently than other dice in said group which were not selected as reference dice, wherein said at least one reference die includes less than all dice in said group.

17. A method of semiconductor testing, comprising:
determining a group of semiconductor dice in a wafer which can be assumed to respond similarly to testing, wherein said group includes less than all dice in said wafer;
selecting at least one reference die from said group, wherein said at least one reference die includes less than all dice in said group; and
applying test flows to said group, wherein a test flow applied to a selected reference die from said group differs from a test flow applied to a die which was not selected as a reference die from said group.

* * * * *